United States Patent
Bonser et al.

(10) Patent No.: US 7,223,698 B1
(45) Date of Patent: May 29, 2007

(54) METHOD OF FORMING A SEMICONDUCTOR ARRANGEMENT WITH REDUCED FIELD-TO ACTIVE STEP HEIGHT

(75) Inventors: Douglas J. Bonser, Hopewell Junction, NY (US); Srikanteswara Dakshina-Murthy, Wappingers Falls, NY (US); Mark C. Kelling, Marlboro, NY (US); John G. Pellerin, Hopewell Junction, NY (US); Johannes F. Groschopf, Fishkill, NY (US); Edward Asuka Nomura, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 11/053,910

(22) Filed: Feb. 10, 2005

(51) Int. Cl.
*H01L 21/311* (2006.01)

(52) U.S. Cl. ............ 438/697; 438/700; 438/692; 257/E21.304; 257/E21.55; 257/E21.546

(58) Field of Classification Search ............ 438/697, 438/700, 637, 647, 657, 680, 740, 743, 745, 438/439
See application file for complete search history.

(56) References Cited

U.S. PATENT DOCUMENTS

| | | | | |
|---|---|---|---|---|
| 5,731,241 A | * | 3/1998 | Jang et al. | 438/424 |
| 5,885,883 A | * | 3/1999 | Park et al. | 438/435 |
| 6,027,982 A | * | 2/2000 | Peidous et al. | 438/424 |
| 6,251,746 B1 | * | 6/2001 | Hong et al. | 438/424 |
| 6,413,828 B1 | * | 7/2002 | Lam | 438/296 |
| 6,642,124 B1 | * | 11/2003 | Yamauchi | 438/425 |
| 6,713,780 B2 | * | 3/2004 | Lam | 257/552 |
| 6,987,064 B2 | * | 1/2006 | Chuang et al. | 438/692 |

* cited by examiner

*Primary Examiner*—David Nhu
(74) *Attorney, Agent, or Firm*—McDermott Will & Emery

(57) ABSTRACT

A method of forming a shallow trench isolation (STI) region in a silicon substrate creates an STI region that extends above a top surface of the silicon substrate. A planarizing dielectric layer is formed on the substrate and extends above the field oxide regions. The planarizing dielectric layer is removed by chemical mechanical polishing or blanket etch back, for example, as well as those portions of the field oxide regions that extend above the top surface of the substrate and the active regions. The step height is thereby eliminated or significantly reduced.

16 Claims, 2 Drawing Sheets

METHOD OF FORMING A SEMICONDUCTOR ARRANGEMENT WITH REDUCED FIELD-TO ACTIVE STEP HEIGHT

FIELD OF THE INVENTION

The present invention relates to semiconductor processing, and more particularly, to formation of shallow trench isolation (STI) regions.

BACKGROUND OF THE INVENTION

An important aim of on-going research in the semiconductor industry is increasing semiconductor performance while decreasing power consummation in the semiconductor devices. Planar transistors, such as metal-oxide semiconductor field effect transistors (MOSFETs), are particularly well-suited for use in high-density integrated circuits. As the size of MOSFETs and other devices decrease, the dimensions of source/drain regions, channel regions, and gate electrodes of the devices, also decrease. One of the techniques to shrink device sizes is that of shallow trench isolation (STI). The use of STI significantly shrinks the area needed to isolate the transistors better than the local oxidation of silicon (LOCOS) technique. STI provides superior latch-up immunity, smaller channel width encroachment and better planarity. The use of STI techniques eliminates the bird-beak frequently encountered with LOCOS.

In conventional STI formation techniques, the hard mask is formed on a silicon substrate that will form the active silicon regions. The hard mask may be, for example, nitride or other suitable material. After patterning, etching is performed through the openings in the hard mask to create recesses in the active silicon regions of the silicon substrate. An insulating material, such as oxide or other suitable material, is deposited in the recesses on the hard mask. A chemical mechanical planarization is then performed to remove the insulator material on top of the hard mask and planarize the top of the STI region. The chemical mechanical planarization stops on the hard mask. Following the planarization, the hard mask layer is removed from the top of the silicon substrate. When the hard mask is a nitride, for example, this is achieved by etching with hot phosphoric acid.

The STI process described above creates STI regions that extend beyond the top surface of the silicon substrate. A schematic depiction of such an arrangement is shown in cross-section in FIG. 1A. A silicon substrate 10 has an STI region 12 formed as described above. A portion 14 of the STI region extends above the silicon substrate 10 by an amount H. This may be referred to as the step height (H). A polysilicon gate 16 is shown passing over the step 14 created by the STI region 12.

The difference in height between the top surface of the STI region 12 and the top surface of the silicon substrate 10 can result in problems in the photolithographic patterning or etch considerations. In other words, the height of the step can cause pattern integrity issues of the polysilicon gate. These include reduced lithography depth of focus, a variation in line width of the polysilicon, jagged edges on the polysilicon line, etc. See, for example, FIG. 1B which shows a top view of a conventional STI arrangement in which the height of the step causes pattern integrity issues. Additionally, if the step is excessive, polysilicon material can be trapped along the step to thereby cause "stringer" defects. Stringers 18 are schematically depicted in FIG. 1B. Hence, undesirable height of the step may produce pattern integrity issues that reduce the quality of the semiconductor device that is ultimately produced.

SUMMARY OF THE INVENTION

There is a need for a method of producing a shallow trench isolation arrangement that has a reduced step height between the shallow trench isolation region and the active regions.

This and other needs are met by embodiments of the present invention which provide a method of forming a semiconductor arrangement comprising the steps of forming a substrate with a top surface, active regions and field oxide regions. The field oxide regions have portions that extend above the top surface of a substrate and the active regions by a step height. The portions of the field oxide regions that extend above the top surface and the active regions are then removed. In certain embodiments of the invention, the method includes forming a dielectric layer over the field oxide regions and the active regions and then performing a chemical mechanical polishing or blanket etch back to planarize the structure. This reduces the field-to-active step height differential, and also reduces or eliminates the impact of a divot in the field oxide that can be created.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the step height created during STI formation and polishing in conventional STI formation methodologies. This reduction in the step height is achieved by the formation of a planarizing dielectric layer on the substrate and the field oxide, followed by a planarization step. This reduces or eliminates the field-to-active step height prior to the gate oxidation and polysilicon deposition steps in the semiconductor manufacturing process. This has a desirable effect on the photolithographic patterning and etch steps to improve pattern integrity and increase operating speed, with also improved yield and precision in formation.

Figure 2:
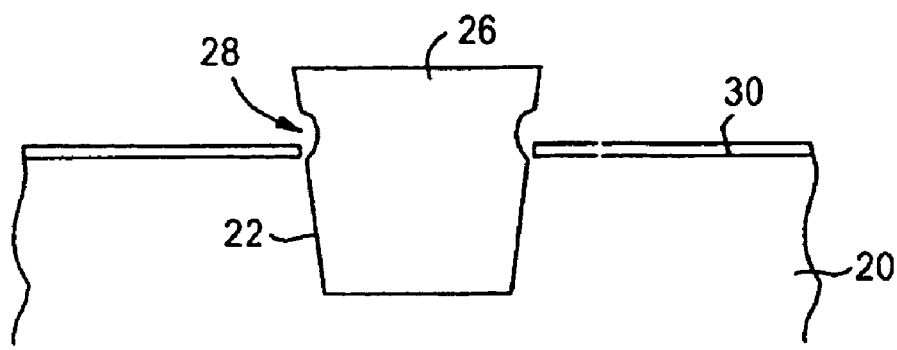
FIG. 2 schematically depicts a cross-section of a portion of a semiconductor wafer during one phase of the formation of a STI region in accordance with embodiments of the present invention.

FIG. 2 schematically depicts a cross-section of a portion of a semiconductor wafer during formation of an STI arrangement in accordance with embodiments of the present invention. A silicon substrate 20 is provided with a trench 22 that has been filled with a suitable insulating (or isolating)

material 26 by a conventional CVD (chemical vapor deposition) process, for example. Suitable insulating materials 26 include silicon nitride and silicon oxide. Typically, the trench 22 is filled with silicon oxide 26 to form the STI region. Some of the other conventional methods of filling the trench 22 include: (a) tetraethyl orthosilicate low pressure chemical vapor deposition (TEOS LPCVD), (b) non-surface sensitive TEOS ozone atmospheric or sub-atmospheric pressure chemical vapor deposition (APCVD or SACVD), and (c) silane oxidation high-density plasma CVD. These methods are exemplary only, as other methods and materials may be employed to fill the trench 22 with a suitable insulating material.

Conventional STI fabrication techniques include forming a pad oxide on an upper surface of a semiconductor substrate, forming a nitride, e.g., silicon nitride, polish stop layer thereon, typically having a thickness of greater than 1000 Å, forming an opening in the nitride polish stop layer, anisotropically etching to form a trench in the semiconductor substrate, forming a thermal oxide liner in the trench and then filling the trench with insulating material, such as silicon oxide, thereby forming an overburden on the nitride polish stop layer. Planarization is then implemented, as by conducting chemical mechanical polishing (CMP). During subsequent processing, the nitride layer is removed along with the pad oxide followed by formation of active areas, which typically involve masking, ion implantation, and cleaning steps. During such cleaning steps, the top corners of the field oxide are isotropically removed, often leaving a void or "divot" in the oxide fill.

The STI divots are problematic in various respects. For example, STI divots are responsible for high field edge leakage, particularly with shallow source/drain junctions. Silicide regions formed on shallow source/drain regions grow steeply downwards, below the junction depth formed at a latter stage resulting in high leakage and shorting. Segregation of dopants, notably boron, at STI field edges reduces junction depth. Accordingly, after the junctions are silicided, silicide penetrating to the substrate causes shorting routes and, hence, large leakage occurrence from the source/drain junctions to a well or substrate.

Figure 1A:
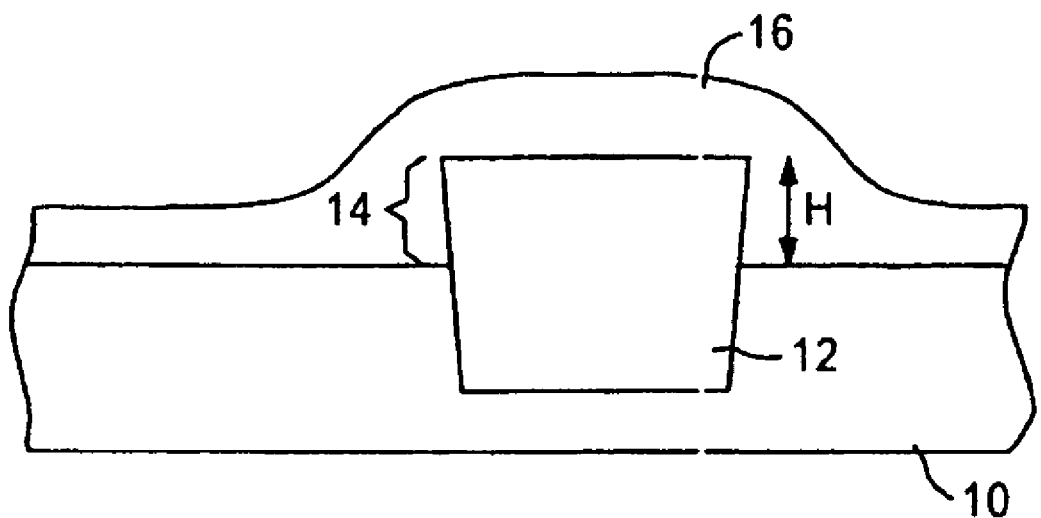
FIG. 1A is a schematic depiction of a cross-section of an STI arrangement formed in accordance with conventional methodologies.
Figure 1B:
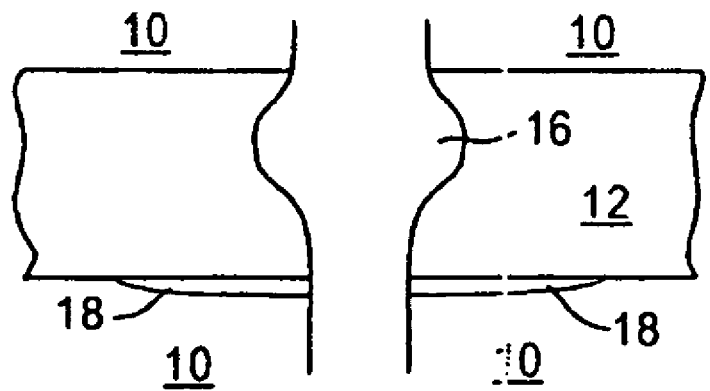
FIG. 1B shows the structure of FIG. 1A in a top view.

In addition, if the STI edge becomes exposed as a result of divot formation, a parasitic transistor with a low threshold voltage is formed over the area with low impurity concentration causing a kink in the characteristics curve of a transistor. The presence of a kink results in electrical characteristics different from the design electrical characteristics, thereby preventing the fabrication of transistors with uniform characteristics. For such a device as formed in FIG. 1A, the step height is then modified according to the steps of the method of the invention depicted in FIGS. 2–4.

In certain embodiments of the invention, such as shown in FIG. 2, an etch stop layer 30 is provided on the substrate 20. The etch stop 30 may be made of a nitride, such as silicon nitride, for example. The etch stop layer 30 may be relatively thin, such as between about 20 Å to about 50 Å. This is in comparison to the step height, which may be as much as 200 Å above the top surface of the substrate 20. The etch stop layer 30 serves as a polish stop layer in the present invention. In certain embodiments of the invention, the etch stop layer 30 is not provided.

Figure 3:
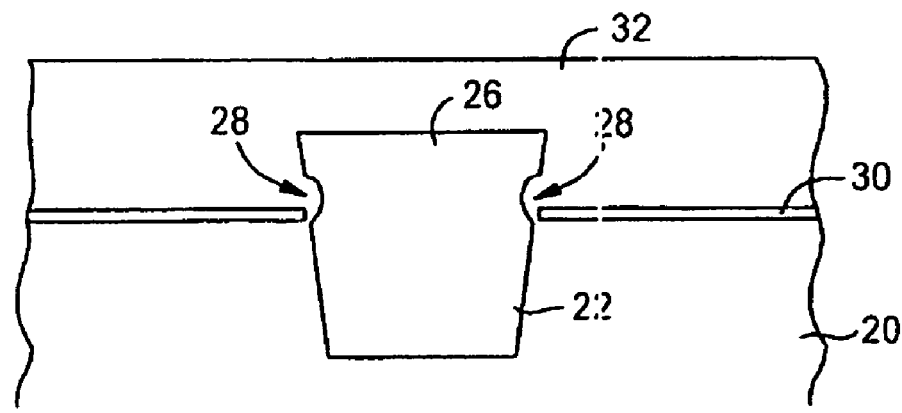
FIG. 3 shows the structure of FIG. 2 following the deposition of a planarizing material in accordance with embodiments of the present invention.

In FIG. 3, a planarizing dielectric layer 32 is deposited over the etch stop layer 30 on the substrate 20, and the field oxide 26. The planarizing dielectric layer 32 fills in the divots 28. Exemplary materials for the planarizing dielectric layer 32 include, but are not limited to, spin-on dielectric material, such as spin-on glass and hydrogen silsesquioxane.

In the embodiment depicted in FIG. 3, the planarizing dielectric layer 32 is deposited to a thickness greater than the height of the field oxide region 26.

Figure 4:
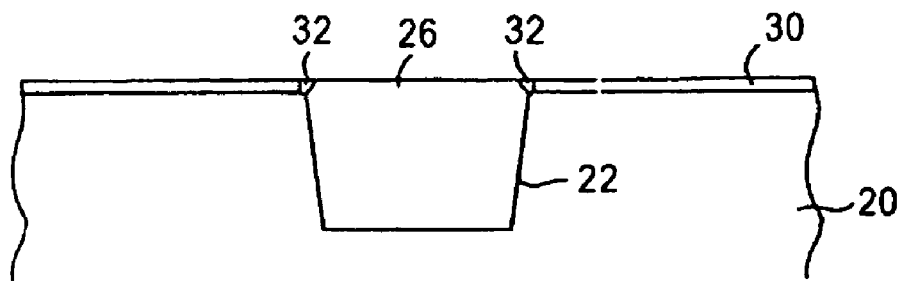
FIG. 4 depicts the structure of FIG. 3 after planarization has been performed in accordance with embodiments of the present invention.

The planarizing dielectric layer 32 is then removed to be at the same level as the active area, as depicted in FIG. 4. This can be accomplished by a number of different techniques, such as chemical-mechanical polishing, or a blanket etch back, which is a less expensive methodology. Advanced oxide polish techniques typically remove less then 10 Å of nitride. The methodology of the invention results in a relatively small step of 10 to 20 Å, with the field oxide 26 being higher than the active regions in the substrate 20. Densification of material through the heat cycle during a gate oxidation process that follows may shrink the step height to be essentially zero.

The reduced or eliminated step height mitigates or eliminates pattern integrity issues of the polysilicon gate including reduced lithography depth of focus, a variation in line with other polysilicon gates, jagged edges, etc. Also, the invention prevents a large step height from causing polysilicon material to be trapped along the step and thereby cause stringer defects.

With the relative co-planarity achieved between the active regions and the STI region, shrinkage of transistor gates is achievable without the undesirable step height that is normally intrinsic to STI formation, so that pattern integrity issues of the polysilicon gate are avoided and the formation of stringer defects is prevented. Improvements in operating speed, and reliability in precision may therefore be achieved.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a semiconductor arrangement, comprising:
   forming a substrate with a top surface, active regions and field oxide regions, the field oxide regions having portions extending above the top surface and the active regions by a step height, the step of forming including: depositing a nitride layer on the substrate top surface, forming a trench through the nitride layer and into the substrate, filling the trench and covering the nitride layer with oxide, planarizing to remove oxide on the nitride layer, removing the nitride layer to form the field oxide regions that extend above the top surface, and subsequently forming active regions in the substrate;
   subsequently forming a planarizing dielectric layer on the field oxide regions after the active regions are formed in the substrate; and
   removing the portions of the field oxide regions that extend above the top surface and the active regions by removing the planarizing dielectric layer and the portions of the field oxide regions that extend above the top surface and the active regions.

2. The method of claim 1, wherein the step of removing the portions of the field oxide regions includes chemical-mechanical polishing to remove the planarizing dielectric layer and the portions of the field oxide region that extend above the top surface of the substrate.

3. The method of claim 2, wherein the planarizing dielectric layer comprises a spin-on dielectric material.

4. The method of claim 2, further comprising performing gate oxidation after the chemical-mechanical polishing.

5. The method of claim 3, further comprising densifying the planarizing dielectric layer prior to chemical-mechanical polishing the planarizing dielectric layer.

6. The method of claim 1, wherein the step of removing the portions of the field oxide region includes etching back the planarizing dielectric layer and the portions of the field oxide regions that extend above the top surface of the substrate.

7. The method of claim 1, wherein the planarizing dielectric layer comprises a spin-on dielectric material.

8. The method of claim 6, further comprising forming an etch stop layer on the active regions prior to forming the planarizing dielectric layer, the planarizing dielectric layer being formed on the etch stop layer and the field oxide regions.

9. The method of claim 8, further comprising performing gate oxidation after the etching back.

10. The method of claim 1, further comprising densifying the planarizing dielectric layer prior to etching back the planarizing dielectric layer.

11. A method of forming a semiconductor arrangement, comprising the steps of:

forming a substrate with a top surface, active regions and field oxide regions, the field oxide regions having portions extending above the top surface and the active regions by a step height;

subsequently forming a planarizing dielectric layer over the previously formed field oxide regions after the active regions are formed in the substrate; and removing the portions of the field oxide regions that extend above the top surface and the active regions.

12. The method of claim 11, wherein the step of removing includes chemical-mechanical polishing to remove the planarizing dielectric layer and the portions of the field oxide regions that extend above the lop surface of the substrate and the active regions.

13. The method of claim 12, further comprising performing gate oxidation after the chemical-mechanical polishing.

14. The method of claim 11, wherein the step of removing includes etching back the planarizing dielectric layer and the portions of the field oxide regions that extend above the top surface of the substrate and the active regions.

15. The method of claim 14, further comprising performing gate oxidation after the etching back.

16. The method of claim 15, further comprising densifying the planarizing dielectric layer prior to etching back the planarizing dielectric layer.

* * * * *